(12) United States Patent
Lu et al.

(10) Patent No.: US 6,583,053 B2
(45) Date of Patent: Jun. 24, 2003

(54) USE OF A SACRIFICIAL LAYER TO FACILITATE METALLIZATION FOR SMALL FEATURES

(75) Inventors: Jiong-Ping Lu, Richardson, TX (US); Changming Jin, Plano, TX (US); David Permana, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/816,436

(22) Filed: Mar. 23, 2001

(65) Prior Publication Data

US 2002/0137337 A1 Sep. 26, 2002

(51) Int. Cl.[7] ............................. H01L 21/4763
(52) U.S. Cl. .................. 438/637; 438/622; 438/626; 438/637; 438/687; 438/700
(58) Field of Search ...................... 438/633, 634, 438/631, 636, 637, 640, 687, 622, 623, 624, 625, 626, 672, 675, 694, 697, 699, 700, 701, 702, 712, 717, 735–740

(56) References Cited

U.S. PATENT DOCUMENTS 5,933,754 A * 8/1999 Mathews et al. ............ 438/629
6,071,809 A * 6/2000 Zhao ........................... 438/634
6,211,071 B1 * 4/2001 Lukanc et al. .............. 438/640
6,274,483 B1 * 8/2001 Chang et al. ................ 438/640
6,294,457 B1 * 9/2001 Liu .............................. 438/623

FOREIGN PATENT DOCUMENTS

JP          11251271        * 9/1999

* cited by examiner

Primary Examiner—Carl Whitehead, Jr.
Assistant Examiner—Thanhha Pham
(74) Attorney, Agent, or Firm—Jacqueline J. Garner; W. James Brady, III; Frederick J. Telecky, Jr.

(57) ABSTRACT

A method of fabricating a copper interconnect using a sacrificial layer. A SiC layer (106) is formed over the dielectric layer (102). A sacrificial layer (108) is formed over the SiC layer (106). A trench (112) is etched in the sacrificial layer (108), the SiC layer (106) and the dielectric layer (102). A sputter etch of the sacrificial layer (108) is used to create a wider opening at a top of the sacrificial layer (108) than at a top of the dielectric layer (102). A barrier layer (114) and copper seed layer (116) are formed. The trench (112) is then filled with copper (124). CMP is used to remove the excess copper (124) and barrier layer (114) stopping on the SiC (106).

16 Claims, 2 Drawing Sheets

USE OF A SACRIFICIAL LAYER TO FACILITATE METALLIZATION FOR SMALL FEATURES

FIELD OF THE INVENTION

The invention is generally related to the field of fabricating copper interconnects in semiconductor devices and more specifically to the use of a sacrificial layer to facilitate metallization for small features.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any liner/barrier metals) are deposited, patterned, and etched to form the interconnect lines. Then, an interlevel dielectric (ILD) is deposited and planarized. In a damascene process, the ILD is formed first. The ILD is then patterned and etched. A thin liner/barrier material is then deposited over the structure followed by copper deposition over the liner/barrier material. Then, the copper and liner/barrier material are chemically-mechanically polished to remove the material from over the ILD, leaving metal interconnect lines. A metal etch is thereby avoided.

The most practical technique for forming copper interconnects is electrochemical deposition (ECD). In this process, after the liner/barrier material is deposited, a seed layer of copper is deposited. Then, ECD is used to deposit copper over the seed layer. At this time, the only practical method for forming the copper seed layer is ionized sputtering. However, sputtering is a line-of-sight technique that has poor step coverage. The major problem for a sputtered film is the overhang near the top of the small features. As a result, an overhang 18 of the seed 16 material occurs at the top of a trench or via 12 as illustrated in FIG. 1. During the subsequent copper ECD, the overhang causes premature closing of the trench or via 12, leaving behind seams and/or voids in the copper fill material.

SUMMARY OF THE INVENTION

The invention is a method of fabricating a copper interconnect using a sacrificial layer. A polish stop layer is formed over a dielectric layer. A sacrificial layer is formed over the polish stop layer. A trench is etched in the sacrificial layer, the polish stop layer, and the dielectric layer. A sputter etch of the sacrificial layer is used to create a wider opening at a top of the sacrificial layer than at a top of the dielectric layer. A barrier layer and copper seed layer are formed. The trench is then filled with copper. CMP is used to remove the excess copper and barrier layer, stopping on the polish stop layer.

An advantage of the invention is providing an improved fill process that eliminates the formation of seams in the fill material.

This and other advantages will be apparent to those of ordinary skill in the art having reference to the specification in conjunction with the drawings.

DETAILED DESCRIPTION OF THE EMBODIMENTS

The invention will now be discussed in conjunction with a dual damascene copper interconnect process. It will be apparent to those of ordinary skill in the art having reference to this specification that the benefits of the invention may be applied to other metallization processes, such as CVD tungsten, CVD Cu, as well as Cu single damascene fabrication.

Figure 1:
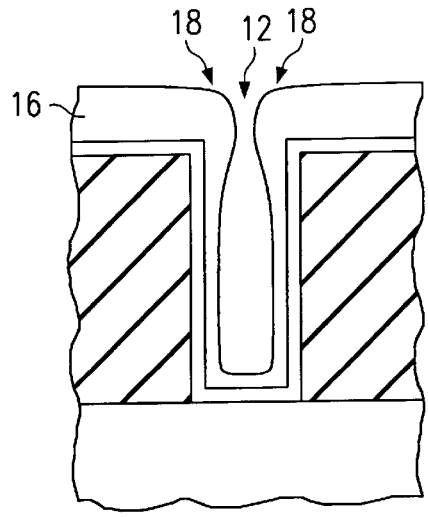
FIG. 1 is a cross-sectional view of a prior art liner/barrier/seed process that results in an overhang of material at the top of a trench, via, or contact.
Figure 2A:
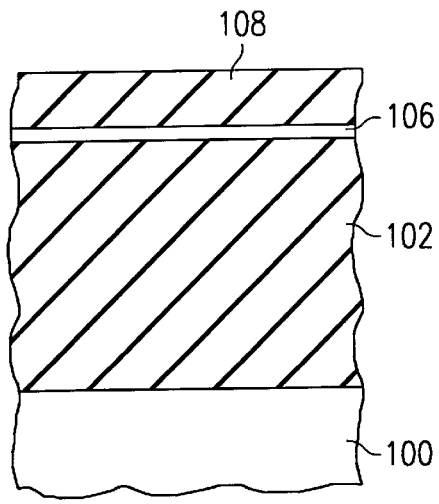
FIGS. 2A–2F are cross-sectional drawings of a copper interconnect structure formed according to an embodiment of the invention.

An embodiment of the invention is discussed with reference to FIGS. 2A–2F. A semiconductor body 100 is processed through formation of a dielectric 102, as shown in FIG. 2A. Semiconductor body 100 typically comprises a silicon substrate with transistors and other devices formed therein. Semiconductor body 100 also includes the pre-metal dielectric (PMD), interlevel dielectric (ILD), and may include one or more metal interconnect layers. Suitable dielectrics for dielectric 102, such as silicon dioxides, fluorine-doped silicate glass (FSG), organo-silicate glass (OSG), hydrogen silesquioxane (HSQ), and combinations thereof, are known in the art. Dielectric 102 is a thick dielectric layer having a thickness in the range of 0.1 um–1 um.

Prior to etching trenches (and vias), a polish stop layer 106 is formed over IMD 104. In the preferred embodiment, polish stop layer 106 comprises SiC. Alternative polish stop materials, such as $Si_3N_4$, are available. The thickness of polish stop layer is in the range of 3–100 nm. Polish stop layer 106 should be as thin as possible to minimize the increase is aspect ratio of the trench and still be thick enough to serve as a CMP polish stop.

Still referring to FIG. 2A, a sacrificial layer 108 is formed over polish stop layer 106. Sacrificial layer 108 comprises a material with high CMP rate compared to the polish stop layer 106. Suitable materials for the sacrificial layer 108 include $SiO_2$, SIOF, and OSG. The thickness of sacrificial layer 108 is in the range of 30–200 nm.

Figure 2B:
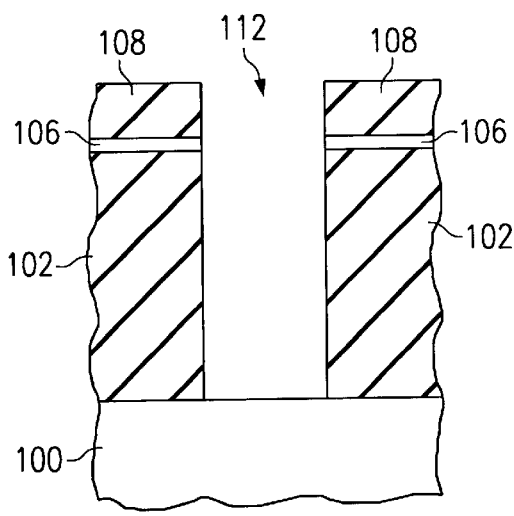

In a copper dual damascene process, both the vias and trenches are etched in the dielectric. Referring to FIG. 2B, a trench 112 is etched in dielectric 102. Vias (not shown) are used to connect to underlying metal interconnect layers. Trench 112 is used to form the metal interconnect lines. In a via first process, a via is patterned and etched through sacrificial layer 108, polish stop layer 106, and dielectric layer 102. The via pattern is removed and vias are filled with a BARC material to protect the via during the trench etch. Trench 112 is then patterned and etched through sacrificial layer 108, polish stop layer 106 and dielectric 102. The trench pattern and BARC material are then removed resulting in the structure of FIG. 2B.

Figure 2C:
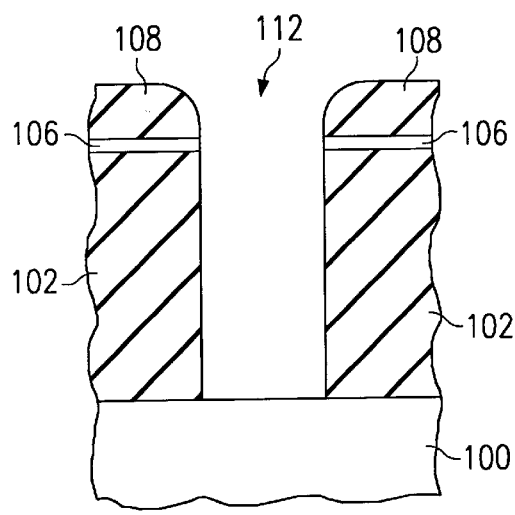

Referring to FIG. 2C, a pre-sputter etch is used to pull back the corners of sacrificial layer 108. Polish stop layer 106 protects the corners of dielectric 102 during the etch. A low bias (with bias voltage in the range of 0–300 V) sputter process with Ar gas is preferred to preferentially remove the corner of the sacrificial layer. The extent of the pull back is determined by the amount of the slope needed to offset potential over-hang of subsequently deposited barrier/seed layers. A typical etch time of 20–100 sec is used to create the required corner. This process also removes metal oxide of the underlying metal layer, which is beneficial for reducing via resistance.

Figure 2D:
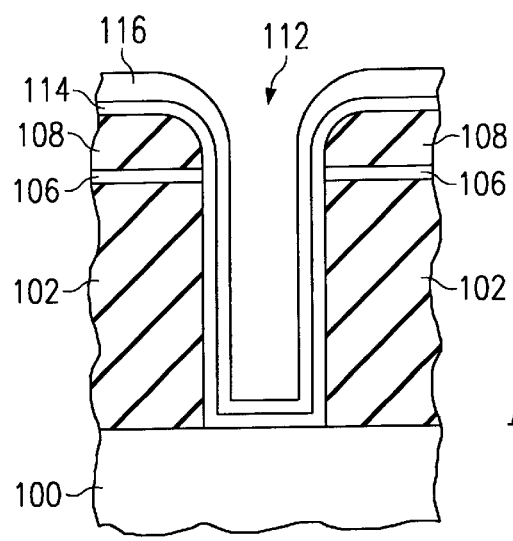

Liner/barrier layer 114 is deposited over sacrificial layer 108 and in trench 112 and via 110, as shown in FIG. 2D. Liner/barrier layer 114 functions to prevent copper diffusion into the dielectric layer. For example, liner/barrier layer 114 may comprise Ti or TiN. Other suitable liner/barrier materials such as Ta, TaN, TiN, TaNSi, TiNSi, MoN and WN are known in the art. Liner/barrier 114 may be deposited using CVD or PVD processes. However, due to the nature of the PVD process, the thickness of the liner/barrier layer 114 would be greater at the top of sacrificial layer 108 if PVD is used. The wide opening in sacrificial layer 108 will minimize the potential over-hang even when PVD is used.

In a copper interconnect process, a copper seed layer 116 is deposited over liner/barrier layer 114. Seed layer 116 is deposited using a PVD process. The barrier/seed stack has minimal overhang near the top of trench 112 due to the wide opening in sacrificial layer 108.

Figure 2E:
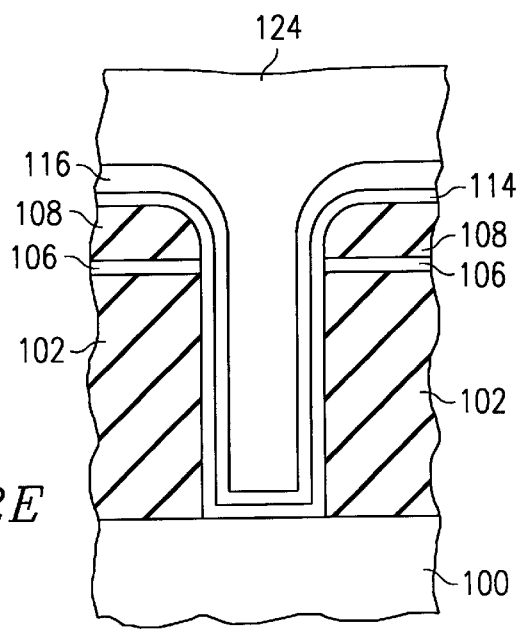

After the seed deposition, copper ECD is performed as shown in FIG. 2E to form copper layer 124. Because the sputter etch removes/reduces the overhang 111, no seam forms in electroplated copper layer 124 due to early closure at the tops of the trench or via. Various copper ECD processes are known in the art. In one example, a 3-step process is used. After placing the wafer in the plating solution, a current of approximately 0.75 Amps is passed through the seed layer 112 for a time on the order of 15 secs. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 2F:
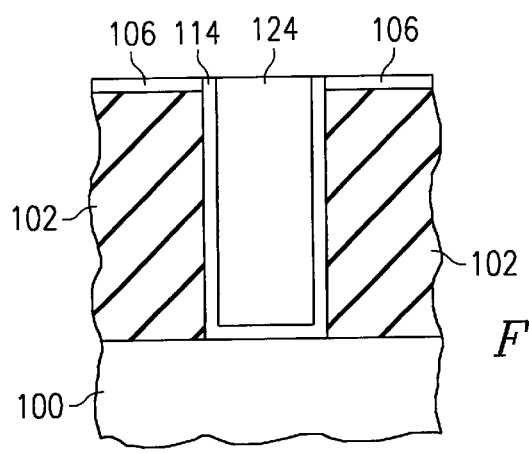

Processing then continues to chemically-mechanically polish the excess copper layer 124 and 116, liner/barrier 114, and sacrificial layer 108 over the field to form the copper interconnect, as shown in FIG. 2F. Sacrificial layer 108 also provides an advantage during this CMP step. A two-step CMP process is used to accomplish this task: the first CMP step remove the excess Cu on the field and stop on the barrier layer 114. The second CMP step removes barrier 114, along with sacrificial layer 108 and stops at the polish stop layer 106. Additional metal interconnect layers may then be formed followed by packaging.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:

forming a dielectric layer over a semiconductor body;

forming a polish stop layer over said dielectric layer;

forming a sacrificial layer over said polish stop layer;

forming a hole in said sacrificial layer, said polish stop layer and said dielectric layer;

performing a sputter etch of said sacrificial layer to pull-back a top corner of said sacrificial layer wherein said polish stop layer protects corners of said dielectric layer from said sputter etch;

forming a barrier layer over said sacrificial layer and in said hole;

depositing a copper seed layer over said barrier layer; and depositing copper to fill said hole.

2. The method of claim 1, wherein said hole comprises a trench.

3. The method of claim 1, wherein said polish stop layer comprises SiC.

4. The method of claim 1, wherein said sacrificial layer comprises $SiO_2$.

5. The method of claim 1, wherein said sacrificial layer comprises SiOF.

6. The method of claim 1, wherein said sacrificial layer comprises OSG.

7. The method of claim 1, further comprising the step of chemically mechanically polishing said copper, said barrier layer, and said sacrificial layer to form a copper interconnect.

8. The method of claim 1, wherein said barrier layer comprises a material selected from the group consisting of Ti, TiN, Ta, TaN, WN, TiNSi, TaNSi, MoN.

9. The method of claim 1, wherein said sputter etch uses a low bias in the range of 0 to −300 volts.

10. A method of fabricating an integrated circuit, comprising the steps of:

forming a dielectric layer over a semiconductor body;

forming a SIC layer over said dielectric layer;

forming a sacrificial layer over said SiC layer, said sacrificial layer comprising a material with a higher CMP polish rate than the SiC;

forming a trench in said sacrificial layer, said SIC layer and said dielectric layer;

performing a sputter etch of said sacrificial layer to create a wider opening at a top of said sacrificial layer than at a top of said dielectric layer, wherein said SiC layer protects corners of said dielectric layers from said sputter etch;

forming a barrier layer over said sacrificial layer and in said trench;

depositing a copper seed layer over said barrier layer, wherein said wider opening at the top of the sacrificial layer minimizes an overhang of said copper seed layer; and depositing copper to fill said trench.

11. The method of claim 10, wherein said sacrificial layer comprises $SiO_2$.

12. The method of claim 10, wherein said sacrificial layer comprises SiOF.

13. The method of claim 10, wherein said sacrificial layer comprises OSG.

14. The method of claim 10, further comprising the step of chemically mechanically polishing said copper, said barrier layer, and said sacrificial layer to form a copper interconnect.

15. The method of claim 10, wherein said sputter etch uses a low bias in the range of 0 to −300 volts.

16. A method of fabricating an integrated circuit, comprising the steps of:

forming a dielectric layer over a semiconductor body;

forming a SIC layer over said dielectric layer;

forming a sacrificial layer over said SIC layer;

forming a trench in said sacrificial layer, said SiC layer and said dielectric layer;

performing a sputter etch of said sacrificial layer to create a wider opening at a top of said sacrificial layer than at a top of said dielectric layer, wherein said SiC layer protects corners of said dielectric layers from said sputter etch;

forming a barrier layer over said sacrificial layer and In said trench;

depositing a copper seed layer over said barrier layer;

depositing copper to fill said trench; and chemically-mechanically polishing said copper and said barrier layer to form a copper interconnect.

* * * * *